United States Patent [19]

Goodwin et al.

[11] Patent Number: 5,694,103
[45] Date of Patent: Dec. 2, 1997

[54] LAMINATED FIGURE 8 POWER METER CORE

[75] Inventors: R. Wendell Goodwin, Dunwoody, Ga.; David N. Makinson; Richard Timko, both of Seneca, S.C.

[73] Assignee: Schlumberger Industries, Inc., Norcross, Ga.

[21] Appl. No.: 637,399

[22] Filed: Apr. 25, 1996

[51] Int. Cl.[6] .............. H01F 17/06; H01F 27/28; G01R 33/00; G01R 7/00

[52] U.S. Cl. .............. 336/178; 336/178; 336/175; 336/188; 324/117 H; 324/142

[58] Field of Search .............. 336/188, 175, 336/178, 234, 165; 324/117 H, 117 R, 127, 141, 142, 207.2

[56] References Cited

U.S. PATENT DOCUMENTS

| | | |
|---|---|---|
| 4,491,790 | 1/1985 | Miller .............. 324/142 |
| 5,027,059 | 6/1991 | De Montgolfier et al. .............. 324/127 |
| 5,338,996 | 8/1994 | Yamamoto .............. 336/234 |
| 5,523,677 | 6/1996 | Kawakami et al. .............. 324/127 |

*Primary Examiner*—Michael L. Gellner
*Assistant Examiner*—Anh Mai
*Attorney, Agent, or Firm*—Leonard W. Pojunas

[57] ABSTRACT

An improved laminated ferromagnetic FIG. 8 power meter core is provided. The core is fabricated from a plurality of ferromagnetic plates and is formed in the general shape of a FIG. 8. The central leg of the core has a cross-sectional area that is larger than the cross-sectional area of other parts of the core. The core gap, in which a Hall-effect sensor is located, has gap faces with chamfered or rounded over edges to reduce fringing and bypassing effects. The core is formed without discontinuous corners that can result in local saturation and, in use, accommodates electrical power conductors in an over-under looping relationship through the openings of the core to provide a more homogeneous magnetic flux within the core and thus more reliable metering. The overall result is a core with a higher saturation point and thus a wider dynamic range than prior art cores.

25 Claims, 5 Drawing Sheets

LAMINATED FIGURE 8 POWER METER CORE

TECHNICAL FIELD

This invention relates generally to meters for measuring electrical power consumption and more specifically to ferromagnetic cores used in such meters to convert electrical current to a proportional magnetic flux for detection and measurement with a Hall-effect sensor.

BACKGROUND OF THE INVENTION

Meters for measuring electrical power consumption have long been integral components of electrical distribution grids. Usually, such meters are coupled in the electrical circuit at the point where electrical power enters a home or business in order measure and display the total energy, usually in kilowatt hours, consumed by the user.

While power meters vary considerably in design and operation, each must address the requirement that electrical current entering a home or business be measured. One method of measuring current has been to provide a toroidal ferromagnetic core with a gap formed at a selected circumferential location on the core. The electrical service conductor or conductors are located to pass through the center of the core. As current flows through the conductors, a corresponding magnetic field proportional to the magnitude of the current is generated around the conductors. This field, in turn, induces a magnetic flux within the ferromagnetic core and across the gap formed in the core. A Hall-effect sensor is located within the gap and produces a measurable Hall voltage that is proportional to the magnetic flux density within the gap and to the bias current supplied to the sensor. If the bias current is made proportional to instantaneous line voltage, the Hall output is a measure of power.

While gaped toroidal cores of the type just discussed are functional, they nevertheless exhibit certain inherent problems and shortcomings. For example, such cores tend to become magnetically saturated at relatively low flux levels due in part to non-uniformly distributed flux density in the core, which leads to local saturation zones. When saturation occurs, the magnetic flux density within the gap is no longer proportional to the current flowing in the supply conductor and the accuracy of the meter is degraded. As a result, larger and more bulky cores must be used, which is undesirable for a number of reasons.

Three legged so called "FIG. 8" ferromagnetic meter cores have been developed. Such a core is illustrated in U.S. Pat. No. 4,742,296 of Petr, et al. FIG. 8 cores are formed of ferromagnetic material and are configured roughly in the shape of the numeral 8 with three legs, two end legs and a center leg. An air gap is formed in the center leg. These cores can be thought of as two toroidal cores joined along a common leg and sharing a common gap in that leg. A Hall-effect sensor is located in the gap to measure magnetic flux density therein. An electrical supply conductor carrying the current to be measured is looped rust through one of openings of the core and then back through the other opening. As electrical current flows through the conductor, counter directed magnetic flux is established in the lobes of the core. The flux from each lobe merges with the flux from the other lobe in the common central leg of the core and the combined flux traverses the gap formed in the common leg. The Hall-effect sensor, then, measures the magnetic flux in the gap as an indication of the current flowing in the supply conductor.

FIG. 8 meter cores have the advantage that they accommodate a larger total magnetic flux before saturating. Thus, the core configuration shown in Petr, et al has an inherently larger dynamic range than simple toroidal cores of similar size. Nevertheless, prior art FIG. 8 cores have also proven to embody their own shortcomings that can limit their dynamic range and thus their accuracy. For example, the generally angular or square cornered configuration of prior art cores such as that shown in Petr et al. can lead to premature magnetic saturation. This is because the magnetic flux density tends to increase at the angular corners and turns of the core. Thus, these regions reach their saturation points sooner than other sections of the core causing the entire core to saturate, even though the average magnetic flux is below the natural saturation point of the ferromagnetic material.

Another source of premature saturation in prior art FIG. 8 cores are magnetic eddy currents that are generated within the core by the magnetic flux. These small eddy currents circulate within the core material in a direction transverse to the direction of the primary flux. The result is similar to turbulence in a fluid flow and has the effect of lowering the saturation threshold of the core. Thus, the dynamic range of the meter core is reduced by the generation of these magnetic eddy currents.

A further problem with prior art cores has resulted from the fact that their central legs usually have the same or similar dimensions as the rest of the core body. In addition, the faces of the gap formed in the leg in which the Hall-effect sensor is located have been flat and sharp edged. The combined result is multi-fold. First, since the center leg generally must accommodate twice the magnetic flux as the rest of the core body, it can obviously be subject to magnetic saturation sooner than the body. Again, saturation at any location in the core means saturation of the entire core and degradation of resulting measurements. Perhaps more critical is the fact that the magnetic flux density across the gap in prior art cores is not uniform. This non-uniformity results from fringing effects at the perimeter of the gap where the magnetic flux lines bulge outwardly from the gap. Further, a phenomenon known as bypassing can also degrade the uniformity of the flux density in the gap even further. Bypassing refers to the situation where magnetic flux lines emanate from the peripheral edges of the gap faces and reenter the core material at another location such as further up the center leg. Each of these phenomena can reduce the integrity of the magnetic flux within the gap and correspondingly reduce the accuracy of measurements made with the core.

Thus, there exists a continuing and heretofore unaddressed need for an improved FIG. 8 power meter core that addresses and resolves the problems and shortcomings of the prior art to result in a meter with a higher dynamic range and increases performance accuracy. Such a core should be configured to insure a more uniform flux density within the ferromagnetic material of the core in order to avoid local saturation zones. Further, the central, gap beating leg should be configured to accommodate a higher magnetic flux in order to match the saturation point of the leg with the rest of the core. The gap faces should be configured to reduce the effects of fringing and bypassing to a minimum and to insure that the magnetic flux in the region where the Hall-effect sensor is located is as uniform as possible. It is to the provision of a power meter core that meets these goals that the present invention is primarily directed.

SUMMARY OF THE INVENTION

It is an object of this invention to provide a ferromagnetic core for electrical power meters that has a high magnetic saturation point and thus a broader usable dynamic range than prior art cores.

Mother object of the invention is to provide a ferromagnetic core for electrical power meters in which fringing and bypassing effects at the gap are reduced to provide a more uniform flux within the gap.

A further object of the invention is to provide a ferromagnetic core for electrical power meters in which magnetic eddy currents within the core material are reduced.

An additional object of the invention is to provide a power meter core configuration wherein current use in a two phase power network can be measured more accurately.

A still further object of the invention is to provide an improved ferromagnetic core for electrical power meters that is economical to produce yet exhibits improved performance over prior art core configurations.

Briefly described, the current invention comprises a ferromagnetic FIG. 8 power meter core having a body formed with a pair of spaced openings through which electrical supply conductors can be looped. The core openings have a curving or soft profile instead of angular intersections to avoid or reduce localized saturation common in prior an cores. A central leg of the core is defined between the two openings and an air gap is formed in the central leg. In use, a Hall-effect or other magnetic flux sensor is located in the gap for detecting and measuring the magnetic flux in the gap during operation of the core.

The body of the core has a laminated construction wherein a plurality of ferromagnetic plates having the FIG. 8 shape of the core are stacked together in juxtaposed relationship with respect to each other. This configuration has been found to increase substantially the overall magnetic reluctance of the core in the transverse direction relative to its reluctance in the plane of the core. The result is a significant decrease in magnetic eddy currents within the core material and a corresponding increase in flux uniformity, dynamic range, and accuracy. The plates of the laminated core preferably are held together by a system of interlocking tabs to avoid weld joints or rivets that can provide a transverse path for magnetic flux and defeat the purpose of the laminated structure.

The central leg of the core is configured to be about twice as wide as the core is thick and to have about twice the cross-sectional area as the other legs of the core. In this way, the central leg, which must accommodate the combined magnetic flux from both sides of the core, does not become magnetically saturated before other portions of the core and thus does not limit the dynamic range of the core. In addition, the Hall-effect sensor can be placed in the central portion of the gap spaced from either side. In this way, the sensor is subjected to a magnetic flux that is more uniform and less affected by fringing and other effects that can occur at the ends of the gap. This results in more accurate detection and measurement of the flux.

The peripheral edges of each gap face are formed with a chamfered or rounded-over configuration. This has been found to reduce magnetic fringing and bypassing effects at the gap ends and consequently to increase the uniformity and consistency of the magnetic flux within the gap. This, in turn, increases the reliability of the meter.

Another novel feature of the invention is the configuration of the service supply conductor loops that extend through the openings of the core. For U. S. two phase power networks, the conductor for one side of the supply is formed with a U-shaped bend that is looped through one opening and then back through the other in a first direction. The conductor for the other side of the supply is formed with a similar U-shaped bend and is looped through the core openings in the opposite direction. Further, the two loops are positioned so that their respective legs define an over-under configuration relative to each other within the core. That is, in one opening of the core, one of the conductors is positioned beneath the other while in the other opening, the other is positioned beneath the one. This configuration has been found to produce a more uniform magnetic flux density within the core that is proportional to the sum of the electric current flowing through each supply conductor. Again, the overall result is an enhancement of dynamic range and core reliability.

Thus, it is seen that an improved ferromagnetic magnetic power meter core is now provided that successfully addresses the problems of the prior art. The core has a wider dynamic range because local magnetic saturation is reduced significantly by the configuration of the core. Further, the laminated structure of the core reduces eddy currents and thus increases the core efficiency. The gap in the central leg of the core is sized to accommodate a Hall-effect sensor in a region of more uniform flux and has gap face edges contoured to reduce fringing and bypassing that can reduce core efficiency. The over-under configuration of the supply conductor loops of the core further enhances the flux density uniformity within the core thus contributing to the core's increased dynamic range and efficiency.

These and other objects, features, and advantages will become more apparent upon review of the detailed description set forth below when taken in conjunction with the accompanying drawings, which are briefly described as follows.

DETAILED DESCRIPTION OF THE PREFERRED EMBODIMENTS

Figure 1:
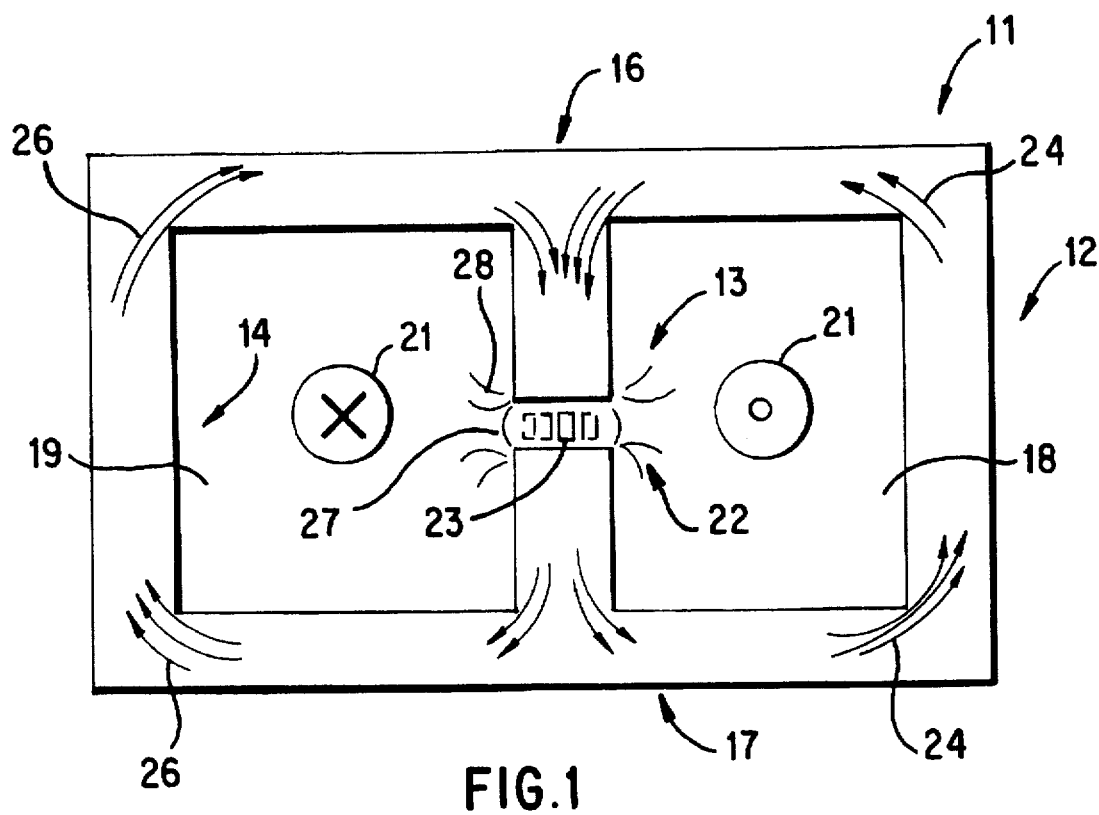
FIG. 1 is a front elevational view of a common prior art power meter core illustrating some of the shortcomings thereof.
Figure 8:
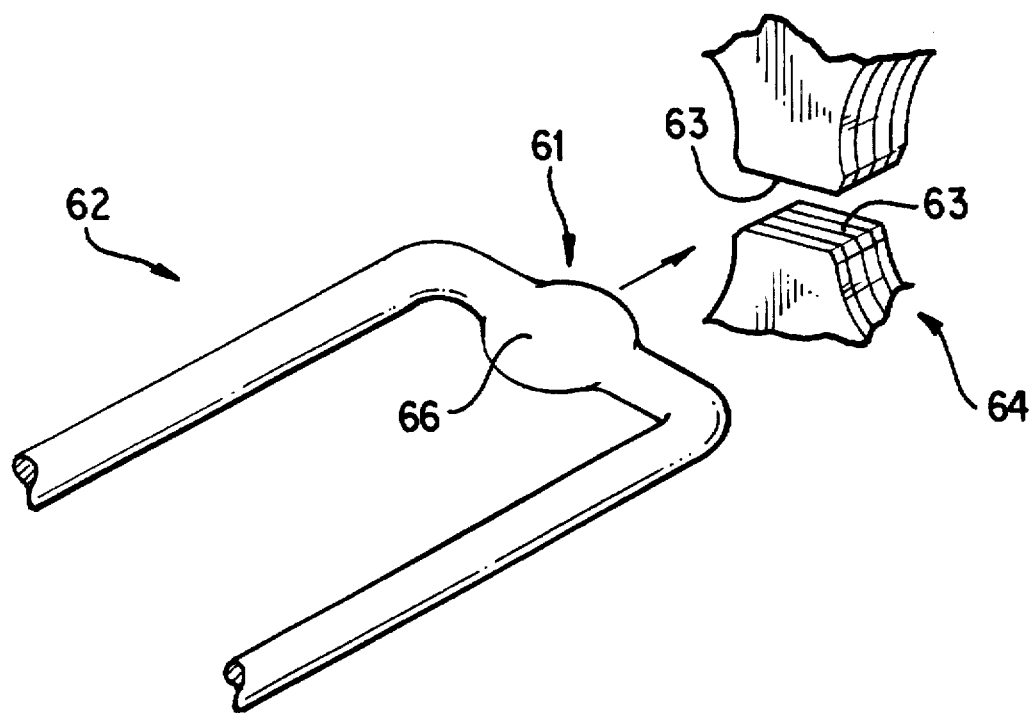
FIG. 8 is a perspective view illustrating the flattened U-shaped conductor of the invention.

Referring now in more detail to the drawings, in which like numerals refer to like parts throughout the several views, FIG. 1 illustrates in front elevational view a common prior art FIG. 8 power meter core. Such a core is illustrated and discussed in U.S. Pat. No. 4,742,296 of Petr, et al. In general, the core 11 is made of a ferromagnetic material and has a first leg 12, a second leg 13, and a third leg 14. The legs 12, 13, and 14 are joined by legs 16 and 17 to form the completed square FIG. 8 shape. Commonly, the core 11 is stamped or otherwise formed from a single piece of ferromagnetic material.

The core 11 defines a first generally rectangular opening 18 between legs 12 and 13 and a second generally rectangular opening 19 between legs 13 and 14. The openings 18 and 19 accommodate an electrical conductor or conductors 21 that typically are formed in the shape of a "U" and looped through one of the openings in the core and back through the other opening. The conductor 21 carries the electrical current that is to be measured. In FIG. 1, the direction of current flow is indicated to be coming out of the page on the right-hand side of the figure and into the page on the left-hand side of the figure. This general configuration of a prior art power meter core is amply illustrated in FIG. 1 of U.S. Pat. No. 4,742,296 of Petr, et al. The center leg 13 of the core 11 is severed at its middle to define an air gap 22. A Hall-effect magnetic flux sensor 23 is located within the air gap to detect and measure the magnetic flux within the gap.

In use, a positive current flowing through the conductor 21 generates a first magnetic flux indicated by arrows 24 within the right-hand lobe of the core and a second magnetic flux indicated by arrow 26 in the left-hand lobe of the core. The magnetic fluxes 24 and 26 traverse their respective lobes of the core in the directions indicated by the arrows according to the right-hand rule. At the center leg 13 of the core 11, the fluxes 24 and 26 combined to form a composite magnetic flux that traverses the center leg. This composite magnetic flux must also traverse the gap 22 formed in the center leg as indicated by the lines of force within and around the gap. Since the magnetic flux within the core is proportional to the electric current within the conductor 21, the Hall-effect sensor 23 effectively measures the current within the conductor by measuring the flux density within the gap 22.

As discussed in the background section above, the prior art power meter core configuration of FIG. 1 exhibits a number of inherent shortcomings. For example, regions of high magnetic flux density within the core material can form at the squared discontinuous corners of the core. In addition, local saturation regions can result if the core flux density is not uniformly distributed within the ferromagnetic material of the core. As a result, the core, as a whole, can exhibit saturation effects at a fraction of the flux density expected because of these local regions of saturation.

Another problem with the prior art cores, such as that shown in FIG. 1, relates to the configuration of the gap 22 in such cores. Traditionally, the center leg of prior art cores has been the same or similar dimensions as the outer two legs. This can mean that the center leg becomes saturated prematurely since it must carry the magnetic flux from both lobes of the core. Thus, the flux density in such a center leg is greater than the average flux density in remaining portions of the core. As a result, local saturation can occur, which causes saturation of the core as a whole.

Further, the gap faces in the center leg of prior art cores traditionally have been rectangular with sharp discontinuous edges. Such a gap face configuration can result in fringing of the magnetic flux around the periphery of the gap as indicated at 27 in FIG. 1. This results in a non-uniform flux density across the gap, which can effect the accuracy of the Hall-effect sensor 23. In addition, the angular corners of the gap faces tend to cause some of the magnetic flux to bypass the gap altogether. This bypassing effect, indicated at 28 in FIG. 1, can occur when some of the magnetic flux emanates from the pole face corners as shown. Again, such bypassing affects the uniformity of the magnetic flux density within the gap and, in turn, can effect the accuracy of the meter as a whole.

Accordingly, it can be seen that power meter cores of the type shown in FIG. 1 can have significant drawbacks.

Figure 2A:
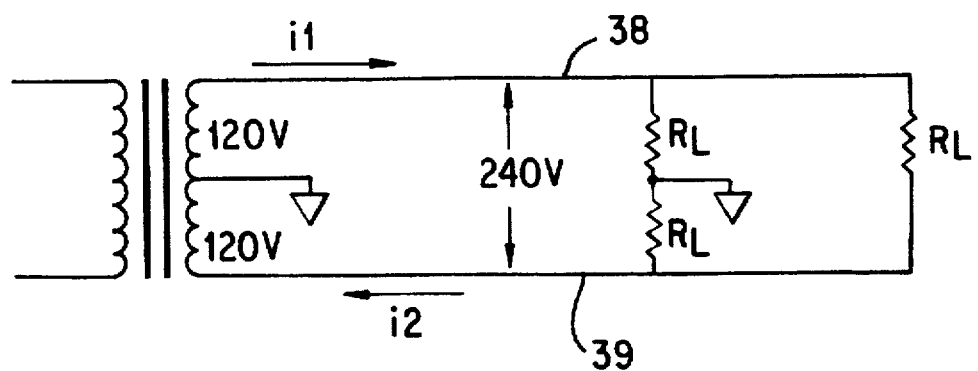
FIG. 2 is a perspective view of a ferromagnetic power meter core configuration that embodies principles of the present invention in a preferred form.
Figure 2:
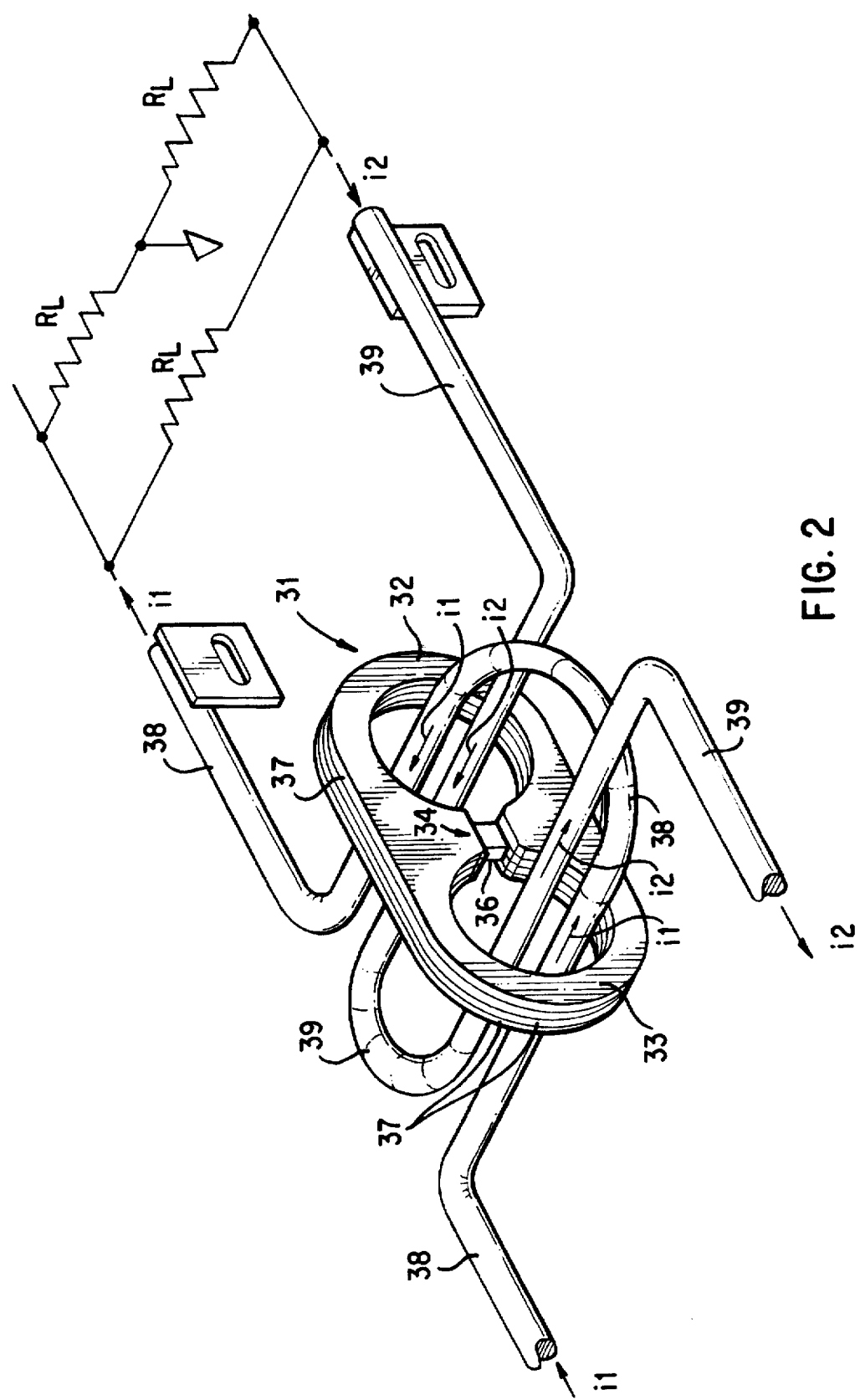

FIG. 2 is a perspective view of an improved ferromagnetic core arrangement for power meters that embodies principles of the present invention in a preferred form. The arrangement of FIG. 2 includes the placement and orientation of the current carrying conductors, and such placement and orientation also forms a part of the present invention.

The apparatus of FIG. 2 comprises a ferromagnetic core 31 that is formed generally in the shape of a FIG. 8 having a right lobe and a left lobe defining right and left openings respectively. The core 31 preferably is formed of a ferromagnetic material of high magnetic permeability so as to provide a low resistance to magnetic flux traversing the core material. An example of ferromagnetic materials with high permeability is the various NiFe alloys with greater than 50% Ni. Other suitable materials can also be used and such materials are known to those of skill in this art. These materials exhibit high magnetic permeabilities and thus low reluctance to magnetic flux.

Figure 4:
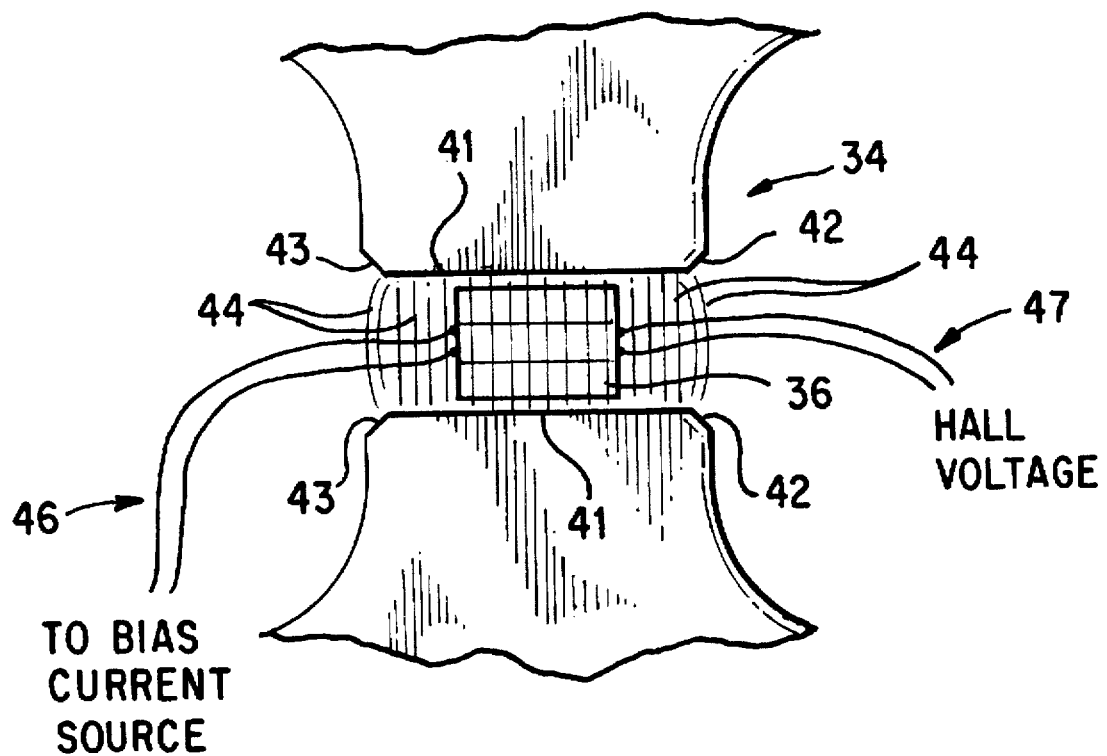
FIG. 4 a front elevational view of the gap potion of applicant's core illustrating a preferred placement of a Hall-effect sensor within the gap.

The core 31 is formed with a right leg 32, a left leg 33, and a center leg 34. The center leg 34 is severed to define an air gap within which a Hall-effect magnetic flux density sensor 36 can be positioned. As illustrated in FIGS. 2 and 4, the cross-sectional area of the center leg 34 of the core 31 is approximately twice the cross-sectional area of the other two legs of the core. This configuration has at least two advantageous consequences. First, the center leg, because of its larger cross-sectional area, is able to accommodate a larger magnetic flux density before saturating. Thus, the combined or composite magnetic flux from each lobe of the core that must traverse the center leg can be accommodated without local saturation. In addition, the larger cross-sectional area of the center leg allows the Hall-effect sensor 36 to be located at a position spaced from the sides of the gap. In this way, the Hall-effect sensor can be positioned away from any magnetic flux fringing or bypassing that can occur at the gap periphery so that the sensor is subjected to a more uniform and homogeneous magnetic flux density for increased measurement reliability.

The overall shape of the core 31 in the present invention is rounded or softened to avoid sharp or discontinuous corners. In the illustrated embodiment, both the interior and exterior contours of the core are rounded. It is possible, however, that only the interior contours be rounded or arcuate in shape while the exterior profile of the core is rectangular. The curved interior contours and their special relationship to the conductors looped through the openings provide a substantial benefit by insuring a more uniform flux density within the core material. In the preferred embodiment, the openings in the left and right lobes of the core respectively preferably are circular or oval to avoid discontinuous interior corners and the legs 32, 33, and 34 are also rounded and devoid of discontinuous corners. This configuration helps to reduce local saturation that can occur at discontinuous corners in prior art configurations.

Preferably, the core 31 is fabricated from a plurality of stacked FIG. 8 shaped plates 37, 37 that are arranged in juxtaposed relationship to each other and held tightly together to form the completed core. As described more fully below, the plates 37,37 are joined together with a system of interlocking tabs, rather than traditional laser welds or rivets to avoid the creation of a transversely extending magnetic path through the core.

The stacked plate configuration of the core 31 provides distinct advantages in reducing magnetic eddy currents within the core that can reduce the core's efficiency. This is because the magnetic permeability in the plane of each plate is significantly higher than the magnetic permeability in the transverse direction of the core from one plate to an adjacent plate. This results from a surface molecular phenomenon wherein the molecular discontinuity between the surfaces of adjacent plates creates a high magnetic reluctance across the discontinuity. Accordingly, eddy currents, which circulate in a transverse direction relative to the core, are inhibited while magnetic flux in the plane of the core is not restricted. The result is a reduction in eddy currents and thus higher overall magnetic permeability, which increases the saturation point of the core and helps to ensure a more homogeneous flux within the core.

The configuration of FIG. 2 is intended for use in measuring electric power usage in U.S. two phase power distribution grids. Such a distribution system is illustrated schematically in FIG. 2A. In such a system, the currents i1 and i2 can and usually are different depending on the distribution of loads $R_L$. In such a system, it is desired to measure the sum of i1 and i2 in order to determine the total power usage by a service customer. The configuration of FIG. 2 accomplishes this goal.

The conductor 38, which conducts the current i1, is configured to loop through the left opening of the core 31 and then back through the right opening of the core. Similarly, the conductor 39 loops in the opposite direction through the left opening of the core and then back through the right opening of the core. In this way, currents i1 and i2 traverse each core opening in the same direction to produce a magnetic flux within the core that is proportional to the sum of the currents i1 and i2. Furthermore, it is seen in FIG. 2 that the conductors 38 and 39 traverse the core 31 in an over-under relationship within respect to each other. That is to say, in the opening formed in the right-hand lobe of the core 31, the conductor 38 is positioned above the conductor 39. Conversely, in the opening formed in the left hand lobe of the core, conductor 39 overlies conductor 38. This configuration has been found to produce a magnetic flux within the core that is more homogeneous and less dependent upon the positioning or placement of the conductors within their respective openings.

Figure 3:
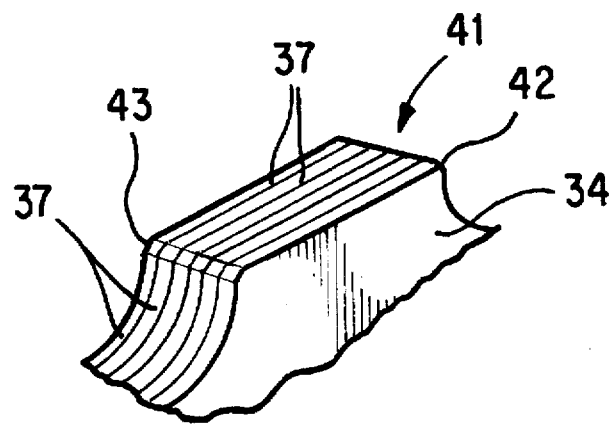
FIG. 3 is a perspective view of one of the gap faces of the present invention showing its unique edge configuration.

FIG. 3 illustrates a preferred configuration of one of the gap faces of the core 31 shown in FIG. 2. As discussed above, the core is fabricated from a plurality of ferromagnetic plates that form a laminated configuration of the core as shown in FIG. 3. The gap face 41, itself, is shown in FIG. 3 as being approximately twice as long as it is wide to provide approximately twice the cross-sectional area of the other two legs of the core. Furthermore, the opposed peripheral edges 42 and 43 of the gap face 41 are not sharp and discontinuous as is common in the prior art, but rather chamfered or rounded over to provide a more continuous rather than discontinuous edge. This has been found to reduce significantly the effects of fringing at the periphery of the gap and to reduce significantly the phenomenon of bypassing wherein magnetic flux escapes the gap altogether.

FIG. 4 illustrates a preferred placement of the Hall-effect sensor 36 within the gap of the central leg 34 of the core 31. In FIG. 4, the chamfered or rounded over edges 42 and 43 of the gap faces 41 are shown. The lines of magnetic force 44 are shown schematically in FIG. 4 to illustrate the reduced fringing and bypassing at the periphery of the gap as a result of the configuration of the gap faces. Because of the increased cross-sectional area of the gap faces 41 as embodied in the increased gap length in the preferred embodiment, the Hall-effect sensor 36 can be located inboard from the edges of the gap. This allows the Hall-effect sensor to be located in a region of the gap where the magnetic flux density is more uniform, homogeneous, and less susceptible to variations as a result of fringing and bypassing. The overall result is increased measurement reliability. Leads 46 are shown coupled to the Hall-effect sensor 36 for providing the sensor with its required bias current. Leads 47 are provided for conducting the Hall voltage that results from the magnetic flux 44 to an electronic circuit such as that shown in Petr, et al. for converting the Hall voltage to a signal indicative of flux density within the gap and thus electrical power usage.

Figure 5:
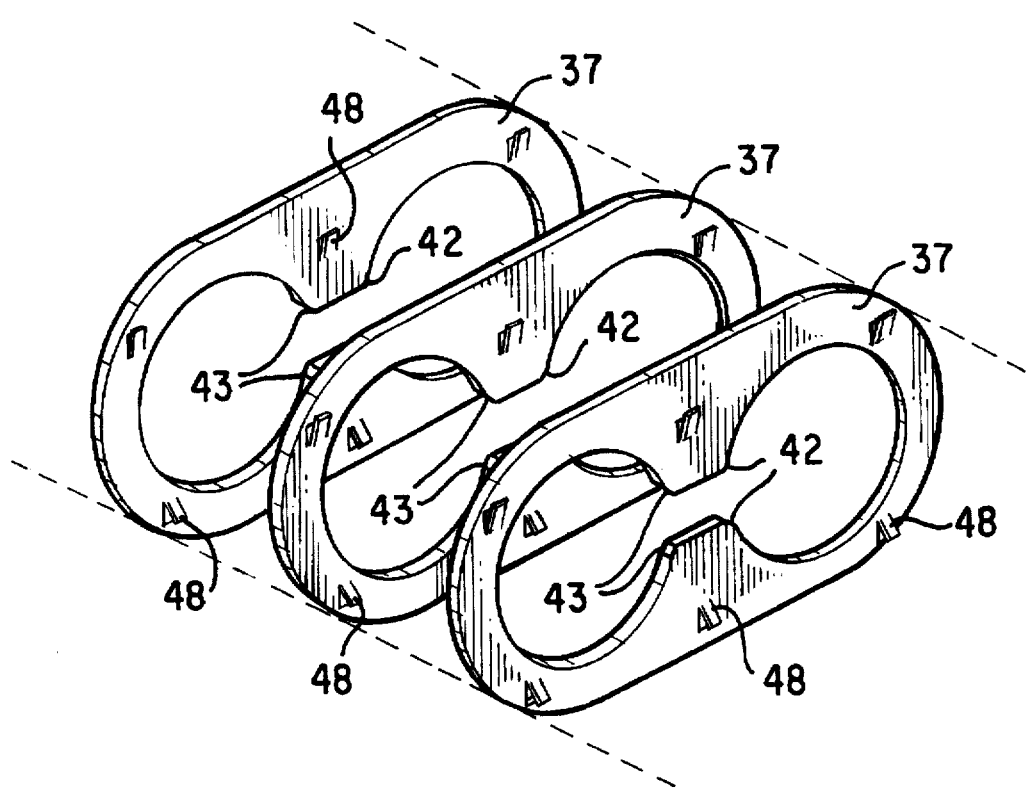
FIG. 5 is an exploded view of applicant's core illustrating the laminated construction thereof.
Figure 6:
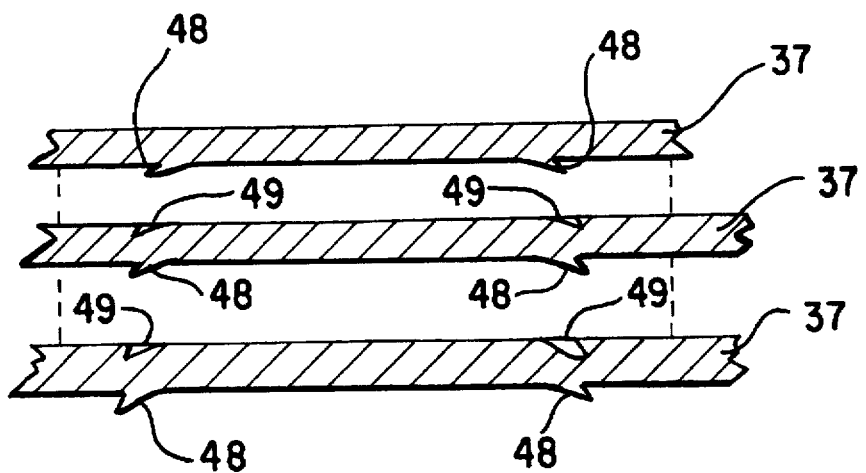
FIG. 6 is a sectional view of a section of the laminations of applicant's core illustrating one method of interlocking the core laminations together to avoid transverse flux paths within, the core.
Figure 7:
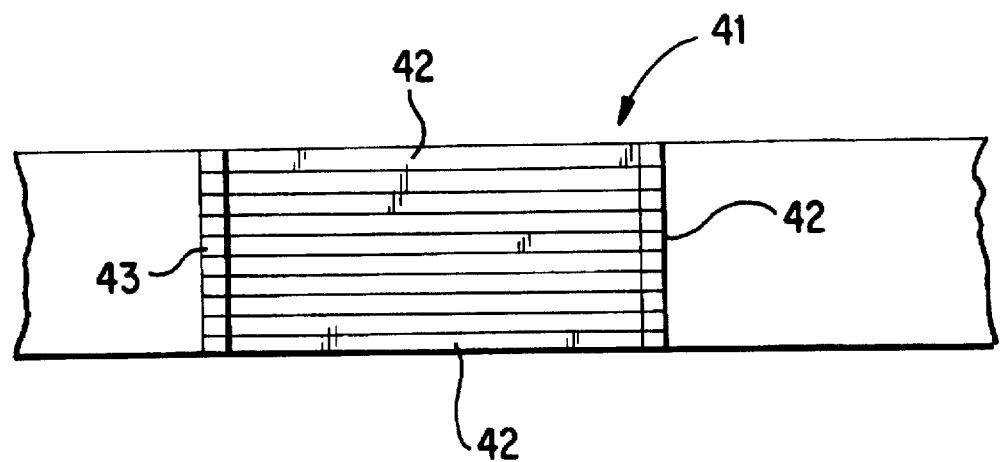
FIG. 7 is a top plan view of one of the gap faces of the present invention illustrating how the laminations are formed to define the chamfered edges of the gap

FIGS. 5 through 7 illustrate a preferred method of joining the individual ferromagnetic plates of the core 31 together to form the completed core. In joining the plates, it is imperative to avoid creating a path for magnetic flux in a direction transverse to the plane of the core. To create such a path would allow eddy currents to develop along the path and could defeat the very purpose of the laminated core. Thus, laser welding and other types of welding, as well as bolts and rivets are precluded as a means for joining the individual plates 37 together.

In FIG. 5, three plates 37 are shown in exploded perspective. It will be obvious that a finished core might comprise a plurality of plates. However, three plates are shown in FIG. 5 for clarity of explanation. The plates 37 are all formed in the general shape of the finished core, including the chamforded edges 42 and 43 of the gap faces. Each of the plates 37 is provided on one side with an array of tabs 48. As illustrated in FIG. 6, the tabs 48 can be formed with a slight hook configuration. An array of tab receiving recesses 49 are formed on the opposite sides of the plates 37 and are positioned to align with the tabs 48 on an adjacent plate. The tab receiving recesses 49 have a shape complimenting that of the tabs 48 and positioned to receive the tabs in interlocking relationship when the two plates are brought and pressed together.

With this configuration, the plates 37 of the core can be positioned together in juxtaposed relationship and pressed so that the tabs 48 are received and interlocked within the tab receiving recesses 49. In this way, the surface discontinuity is maintained between each plate throughout its entire extent while at the same time the plates are held securely and tightly together by the interlocking tabs 48 and tab receiving recesses 49. The resulting multiple surface discontinuities in the transverse direction of the core 31 significantly decreases magnetic eddy currents in the core and thus increases the core's dynamic range and efficiency.

FIG. 7 is a top plan view of one of the gap faces 41. In this view, the increased length of the gap face is clearly shown as is the chamfered or rounded gap face edges 42 and 43. The laminated structure of the core is also clearly illustrated in FIG. 7.

FIG. 8 illustrates yet another embodiment of the present invention wherein the bight portion 61 of the U-shaped conductor 62 is flattened to allow the conductor to be inserted easily between the pole faces 63 of the core 64 during the construction process. The flattening of the bight portion into a flat button-shaped section 66 allows for ease of construction and for a core with a gap narrow than the diameter of the conductor used in the meter. The flattening process itself can be accomplished by a variety of means but preferably is created by a hydraulic press that flattens the conduct as it is formed into its U-shape.

The invention has been described herein in terms of preferred embodiments. It will be understood by those of skill in the art, however, that various changes and enhancements might well be made to the embodiments illustrated herein, all within the scope of the invention. For example, the interlocking tabs 48 and tab receiving recesses 49 shown in FIG. 6 clearly could be replaced by any number of systems for interlocking the plates of the core together without disrupting the surface continuity in the transverse direction of the core. Thus, any means for interlocking the plates together in this fashion are contemplated by the present invention. Further, the invention has been illustrated in terms of measuring two-phase electrical power that is common within the United States. On other continents, such as Europe, single phase power is common. Obviously, the present invention is equally applicable to such single phase systems and in such instances, a single conductor might be looped through the openings of the core rather than the two conductors shown in FIG. 2 hereof. Finally, it will be understood that the principals disclosed herein and illustrated in the accompanying drawings could be embodied in physical structures of varying configurations and packaging. These and other additions, deletions and modifications might well be made to the preferred embodiments illustrated herein without departing from the spirit and scope of the invention as set forth in the claims.

We claim:

1. A ferromagnetic power meter core for converting an electrical current flowing in a conductor to a proportional magnetic flux for detection by a magnetic flux sensor, said power meter core comprising:

a body of ferromagnetic material formed substantially in the shape of a FIG. 8 with a pair of spaced arcuate openings through which a current carrying conductor can be looped and a central leg separating said spaced openings;

said FIG. 8 shaped body having a first lobe having a cross-sectional area surrounding one of said openings and defining a first magnetic circuit of said core at one end of said body and a second lobe having a cross-sectional area surrounding the other one of said openings and defining a second magnetic circuit of said core at the opposite end thereof, each of said magnetic circuits sharing a common path through said central leg of said body;

said central leg having a cross-sectional area greater than the cross-sectional area of said lobes and being severed to define an air gap between spaced opposed gap faces of said central leg, said air gap for accommodating the magnetic flux sensor, whereby a current carrying conductor looped through one of the openings in the core body and back through the other opening induces counter directed magnetic fluxes within the lobes of the core body with the fluxes combining in the central leg of the core into a composite flux that traverses the gap and is detected by the magnetic flux sensor.

2. A ferromagnetic power meter core as claimed in claim 1 and wherein the cross-sectional area of said central leg is about twice the cross sectional area of said lobes.

3. A ferromagnetic power meter core as claimed in claim 2 and wherein said body has a thickness and wherein said central leg is about twice as wide as the thickness of said body.

4. A ferromagnetic power meter core as claimed in claim 1 and wherein each of said gap faces has a peripheral edge and wherein at least a portion of the peripheral edge of at least one of said gap faces is contoured to reduce magnetic flux fringing and bypassing.

5. A ferromagnetic power meter core as claimed in claim 4 and wherein said peripheral edges of said gap faces are chamfered.

6. A ferromagnetic power meter core as claimed in claim 4 and wherein said peripheral edges of said gap faces are rounded over.

7. A ferromagnetic power meter core as claimed in claim 1 and wherein said body is formed from a plurality of stacked ferromagnetic plates arranged in juxtaposed relationship to define a laminated structure of said core.

8. A ferromagnetic power meter core as claimed in claim 7 and further comprising interlocking means for joining said ferromagnetic plates together while maintaining surface discontinuity between successive ones of said plates.

9. A ferromagnetic power meter core as claimed in claim 8 and wherein said interlocking means comprises tabs formed on one side of at least some of said plates and tab receiving recesses formed on the other side of at least some of said plates, said tab receiving recesses being positioned and configured to align and interlock with the tabs on an adjacent plate when the plates are brought together.

10. A ferromagnetic power meter core as claimed in claim 1 and wherein said core body has opposed sides and further comprising a first conductor having a U-shaped bend formed therein, said U-shaped bend of said first conductor having first and second legs and a bight portion and being positioned with its first leg extending through one of said openings in said body and its second leg extending through the other opening in said body, the bight portion of said U-shaped bend of said first conductor being located to one side of said core body, and a second conductor having a U-shaped bend formed therein, said U-shaped bend of said second conductor having first and second legs and a bight portion and being positioned with its first leg extending through one of said openings in said body and its second leg extending through the other opening in said body, the bight portion of said U-shaped bend of said second conductor being located to the opposite side of said core body, whereby current flowing in opposite directions in said first and second conductors passes through each of said openings in the same direction to induce a magnetic flux in said core proportional to the sum of the currents in said conductors.

11. A ferromagnetic power meter core as claimed in claim 10 and wherein the leg of one of said conductors passes over the leg of the other conductor in one of said openings and the leg of the other conductor passes over the leg of the one conductor in the other one of said openings to induce a more homogeneous magnetic flux in said core.

12. A FIG. 8 power meter core formed of ferromagnetic material and having a first lobe defining a first arcuate opening and a second lobe defining a second arcuate opening spaced from said first opening, said first opening being separated from said second opening by a central leg of said core, said central leg being severed to define an air gap between first and second gap faces of said central leg for accommodating a magnetic flux sensor in said gap.

13. A FIG. 8 power meter core as claimed in claim 12 and wherein said first and second lobes define first and second legs at opposed ends of said core with said first and second legs having cross-sectional areas, said central leg having a cross-sectional area greater than the cross-sectional areas of said first and second legs.

14. A FIG. 8 power meter core as claimed in claim 13 and wherein the cross-sectional area of said central leg is about twice the cross-sectional area of said first and second legs.

15. A FIG. 8 power meter core as claimed in claim 14 and wherein said core has a thickness and wherein each of said gap faces is substantially rectangular with a width corresponding to the thickness of said core and a length greater than the thickness of said core.

16. A FIG. 8 power meter core as claimed in claim 14 and wherein the length of each of said gap faces is about twice the thickness of said core.

17. A FIG. 8 power meter core as claimed in claim 12 and wherein each of said gap faces has a peripheral edge that is contoured to reduce magnetic fringing and bypassing.

18. A FIG. 8 power meter core as claimed in claim 17 and wherein the peripheral edges of the gap faces are chamfered.

19. A FIG. 8 power meter core as claimed in claim 17 and wherein the peripheral edges of the gap faces are rounded over.

20. A FIG. 8 power meter core as claimed in claim 12 and wherein said core is formed from a plurality of stacked ferromagnetic plates defining a laminated structure of said core.

21. A FIG. 8 power meter core as claimed in claim 20 and further comprising means for interlocking said ferromagnetic plates together while preserving surface discontinuity in a direction transverse to said plates.

22. A FIG. 8 power meter core as claimed in claim 21 and wherein said means for interlocking said ferromagnetic plates comprises an array of tabs and tab receiving recesses formed in said plates with said tab receiving recesses of each plate being configured and positioned to align and interlock with said tabs on an adjacent plate to interlock said plates to together forming said laminated core.

23. A laminated FIG. 8 power meter core comprising a plurality of ferromagnetic plates interlocked together, said core having a first lobe defining a first opening and a first leg of said core on one end thereof and a second lobe defining a second opening spaced from said fast opening and a second leg of said core on the other end thereof, said first and second legs having a cross-sectional area, said first opening being separated from said second opening by a central leg of said core, said central leg being severed to define an air gap between first and second gap faces of said central leg and having a cross-sectional area about twice the cross-sectional area of said first and second legs, each of said gap faces having a peripheral edge that is contoured to reduce magnetic fringing and bypassing, a magnetic flux sensor located within said gap for sensing magnetic flux therein, and at least one conductor looped through said first opening and back through said second opening whereby a current flowing in said conductor induces magnetic fluxes within the lobes of the core that combine in the central leg and traverse the gap where the flux is detected as an indication of the magnitude of the current within the conductor.

24. A laminated FIG. 8 power meter core as claimed in claim 23 and wherein a portion of said conductor is flattened for insertion through said air gap during construction of said power meter core.

25. A laminated power meter core as claimed in claim 24 and wherein said conductor is U-shaped having a pair of spaced legs and a bight portion and wherein said conductor is flattened at said bight portion.

* * * * *